US 6,583,572 B2

(12) United States Patent
Veltrop et al.

(10) Patent No.: US 6,583,572 B2
(45) Date of Patent: Jun. 24, 2003

(54) INDUCTIVE PLASMA PROCESSOR INCLUDING CURRENT SENSOR FOR PLASMA EXCITATION COIL

(75) Inventors: Robert G. Veltrop, Eagle, ID (US); Jian J. Chen, Fremont, CA (US); Thomas E. Wicker, Reno, NV (US)

(73) Assignee: Lam Research Corporation, Fremont, CA (US)

( * ) Notice: Subject to any disclaimer, the term of this patent is extended or adjusted under 35 U.S.C. 154(b) by 286 days.

(21) Appl. No.: 09/820,709

(22) Filed: Mar. 30, 2001

(65) Prior Publication Data

US 2002/0179250 A1 Dec. 5, 2002

(51) Int. Cl.[7] .................................................. H01J 7/24
(52) U.S. Cl. ............................ 315/111.51; 315/111.21; 118/723 I; 118/723 IR
(58) Field of Search ........................ 315/111.51, 111.21; 118/723 R, 723 T, 723 IR, 728; 156/345.35, 345.48; 204/298.08

(56) References Cited

U.S. PATENT DOCUMENTS

| | | | |
|---|---|---|---|
| 4,948,458 A | 8/1990 | Ogle | 156/643 |
| 5,226,967 A | 7/1993 | Chen et al. | 118/723 |
| 5,277,752 A | 1/1994 | Aydil et al. | 156/643 |
| 5,304,279 A | 4/1994 | Coultas et al. | 156/345 |
| 5,368,710 A | 11/1994 | Chen et al. | 204/192.32 |
| 5,401,350 A | 3/1995 | Patrick et al. | 156/345 |
| 5,558,722 A | 9/1996 | Okumura et al. | 118/723 I |
| 5,573,595 A * | 11/1996 | Dible | 118/723 MP |
| 5,589,737 A | 12/1996 | Barnes et al. | 315/111.21 |
| 5,731,565 A | 3/1998 | Gates | 219/121.54 |
| 5,759,280 A | 6/1998 | Holland et al. | 118/723 I |
| 5,795,429 A | 8/1998 | Ishii et al. | 156/345 |
| 5,800,619 A | 9/1998 | Holland et al. | 118/723 I |
| 5,874,704 A | 2/1999 | Gates | 219/121.43 |
| 6,028,395 A | 2/2000 | Holland et al. | 315/111.51 |
| 6,164,241 A | 12/2000 | Chen et al. | 118/723 I |
| 6,319,355 B1 * | 11/2001 | Holland | 156/345.48 |
| 6,388,383 B1 * | 5/2002 | Ni et al. | 315/111.81 |
| 6,507,155 B1 * | 1/2003 | Barnes et al. | 315/111.51 |

FOREIGN PATENT DOCUMENTS

| | | |
|---|---|---|
| EP | 0756309 A1 | 1/1997 |
| EP | 0838843 A2 | 4/1998 |
| EP | 0840349 A2 | 5/1998 |

* cited by examiner

Primary Examiner—Don Wong
Assistant Examiner—Thuy Vinh Tran
(74) Attorney, Agent, or Firm—Lowe Hauptman Gilman & Berner, LLP

(57) ABSTRACT

An inductive plasma processor includes an RF plasma excitation coil having plural windings, each having a first end connected in parallel to be driven by a single RF source via a single matching network. Second ends of the windings are connected to ground by termination capacitors, in turn connected by a lead to ground. A current sensor including a winding around a toroidal core is coupled to the lead between each termination capacitor and ground. The current sensor is surrounded by a grounded shield. There is minimum electromagnetic interference from an ambient RF environment to the current sensor, to provide an accurate current sensor.

14 Claims, 6 Drawing Sheets

INDUCTIVE PLASMA PROCESSOR INCLUDING CURRENT SENSOR FOR PLASMA EXCITATION COIL

FIELD OF INVENTION

The present invention relates generally to inductive plasma processors including an RF excitation coil and more particularly to such a processor including a shielded current sensor coupled to a low voltage portion of a branch including a winding of the coil.

BACKGROUND ART

One type of processor for treating workpieces with an RF plasma in a vacuum chamber includes a coil responsive to an RF source. The coil responds to the RF source to produce electromagnetic fields that excite ionizable gas in the chamber to produce a plasma. Usually the coil is on or adjacent to a dielectric window that extends in a direction generally parallel to a planar horizontally extending surface of the processed workpiece. The excited plasma interacts with the workpiece in the chamber to etch the workpiece or to deposit material on it. The workpiece is typically a semiconductor wafer having a planar circular surface or a solid dielectric plate, e.g., a rectangular glass substrate used in flat panel displays, or a metal plate.

Ogle, U.S. Pat. No. 4,948,458 discloses a multi-turn spiral planar coil for achieving the above results. The spiral, which is generally of the Archimedes type, extends radially and circumferentially between its interior and exterior terminals connected to the RF source via an impedance matching network. Coils produce oscillating RF fields having magnetic and electric field components that penetrate through the dielectric window to accelerate electrons and ions in a portion of the plasma chamber close to the window. The spatial distribution of the magnetic field in the plasma portion close to the window is a function of the sum of individual magnetic field components produced by the current at each point of the coils. The inductive component of the electric field is produced by the time varying magnetic field, while the capacitive component of the electric field is produced by the RF voltage in the coils. The inductive electric field is azimuthal while the capacitive electric field is vertical downward to the workpiece. The current and voltage differ at different points because of transmission line effects of the coil at the frequency of the RF source.

For spiral designs as disclosed by and based on the Ogle '458 patent, the RF currents in the spiral coil are distributed to produce a ring shaped electric field resulting in a toroidal plasma close to the window, which is where power is absorbed by the gas to excite the gas to a plasma. At low pressures, in the 1.0 to 10 mTorr range, diffusion of the plasma from the ring shaped region where plasma density is greatest tends to smear out plasma non-uniformity and increases plasma density in the chamber center just above the center of the workpiece. However, the diffusion alone generally can not sufficiently compensate plasma losses to the chamber walls and plasma density around the workpiece periphery can not be changed independently. At intermediate pressure ranges, in the 10 to 100 mTorr range, gas phase collisions of electrons, ions, and neutrals in the plasma further prevent substantial diffusion of the plasma charged particles from the toroidal region. As a result, there is a relatively high plasma density in a ring like region of the workpiece but low plasma densities in the center and peripheral workpiece portions.

These different operating conditions result in substantially large plasma flux (i.e., plasma density) variations between inside the toroid and outside the toroid, as well as at different azimuthal angles with respect to a center line of the chamber that is at right angles to the plane of the workpiece holder (i.e., chamber axis). These plasma flux variations result in a substantial standard deviation, i.e., in excess of six percent, of the plasma flux incident on the workpiece. The substantial standard deviation of the plasma flux incident on the workpiece has a tendency to cause non-uniform workpiece processing, i.e., different portions of the workpiece are etched to different extents and/or have different amounts of materials deposited on them.

Our co-pending, commonly assigned application entitled "INDUCTIVE PLASMA PROCESSOR HAVING COIL WITH PLURAL WINDINGS AND METHOD OF CONTROLLING PLASMA DENSITY," (Lowe Hauptman Gilman and Berner Docket No. 2328-050) discloses an arrangement for providing greater uniformity of plasma flux incident on the workpiece. In a preferred arrangement disclosed in the co-pending application, the coil current amplitude is measured to verify that the correct current is flowing in the coil and to assist in providing control, if necessary, for the plasma density.

In the past, electrical parameters to assist in controlling the operation of RF coil-excited plasma processors have involved measuring parameters, such as coil current amplitude, voltage amplitude and the phase angle between the voltage and the current. Other parameters have also been monitored, such as the forward and reflected powers. These parameters have been measured at high voltage portions of circuitry driving the matching network or coil. As a result, the current sensors, which typically include a toroidal coil surrounding a lead in a branch including a coil winding, are usually coupled to noise-inducing RF fields. As a result, the sensors are affected by the ambient RF fields and tend to derive inaccurate indications of the coil current.

Shielding of the coil toroidal winding in these prior art configurations to reduce or substantially eliminate the electric noise coupled to the sensor toroidal coil has usually not been feasible. This is because the shield, in order to be effective, must be grounded and in close proximity to the sensor toroidal coil which is coupled to high voltage portions of the circuitry. The high voltage and shield proximity requirements are likely to result in a discharge between the shield and coil or between the shield and other parts of the circuitry driving the coil. In addition, the grounded shield can be strongly coupled in proximity to the high voltage and can greatly perturb the electric field distribution.

It is, accordingly, an object of the present invention to provide a new and improved inductive plasma processor having an RF excitation coil with an improved sensor for the current flowing in the coil.

An additional object of the invention is to provide an inductive plasma processor including an RF plasma excitation coil with an improved high accuracy current sensor.

Another object of the invention is to provide an inductive plasma processor including an RF plasma excitation coil with a current sensor that is shielded from electromagnetic fields and which is arranged so that the shield is not particularly subject to inducing a breakdown, even though it is grounded.

SUMMARY OF THE INVENTION

According to the invention, an inductive processor includes an RF plasma excitation coil including a winding having an input terminal and an output terminal. An RF source coupled to the coil supplies the input terminal with RF excitation current. The winding has one end connected in series with the RF source and matching network and a second end connected by a lead to ground. A current sensor is coupled to the lead, and surrounded by a grounded shield to prevent ambient RF fields from being coupled to the sensor.

Preferably, the coil includes plural windings, each in a separate branch and including an input terminal and an output terminal. Each of the input terminals is connected to be driven in parallel by the RF source and the matching network. Each of the output terminals is connected by a separate lead to ground. A separate current sensor is coupled to each of the ground leads and a shield arrangement coupled with each sensor decouples RF fields from the sensors.

In a preferred configuration, each branch includes a capacitor connected between the coil output terminal of the branch and the ground lead. The current sensor is preferably placed between the capacitor and the ground lead, such that the RF voltage, as well as the RF fields, are substantially close to zero, resulting in minimum electromagnetic interference (EMI) to the current sensor.

Typically, the sensor includes a toroidal structure, e.g., a toroidal coil, a toroidal magnetic core, as well as rectifying and filtering circuitry, and the grounded shield substantially surrounds the toroidal structure.

DETAILED DESCRIPTION OF THE DRAWING

Figure 1:
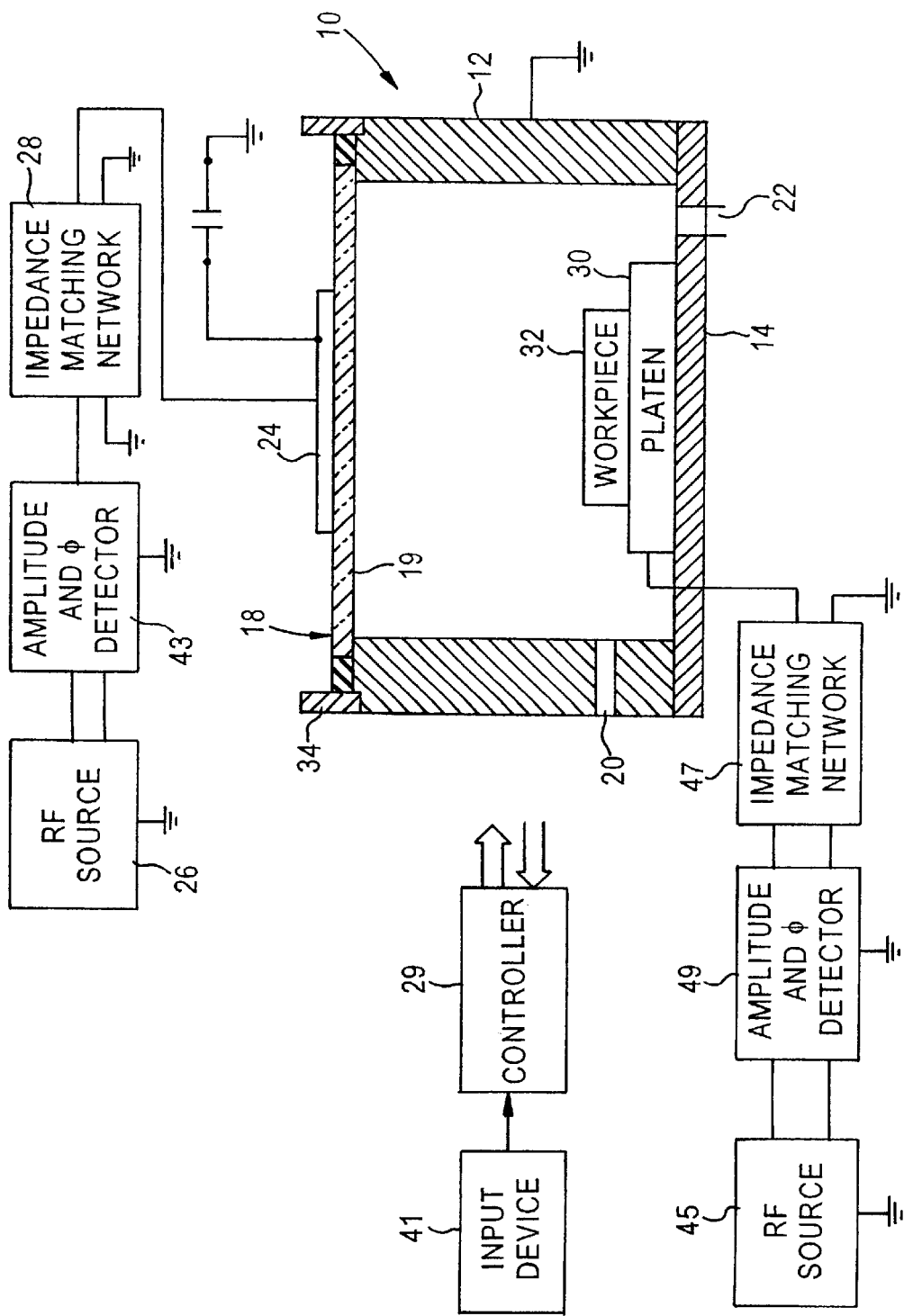
FIG. 1 is a schematic diagram of a vacuum plasma processor of the type employed in connection with the present invention.

The vacuum plasma workpiece processor of FIG. 1 of the drawing includes vacuum chamber 10, shaped as a cylinder having grounded metal wall 12, metal bottom end plate 14 and circular top plate structure 18, consisting of a dielectric window structure 19, having the same thickness from its center to its periphery. Sealing of vacuum chamber 10 is provided by conventional gaskets (not shown). The processor of FIG. 1 can be used for etching a semiconductor, dielectric or metal substrate or for depositing materials on such substrates.

A suitable gas that can be excited to a plasma state is supplied to the interior of chamber 10 from a gas source (not shown) via port 20 in side wall 12 and further distributed uniformly through a gas distribution mechanism (not shown). The interior of the chamber is maintained in a vacuum condition, at a pressure that can vary in the range of 1–1000 milliTorr, by a vacuum pump (not shown) connected to port 22 in end plate 14.

The gas in chamber 10 is excited by a suitable electric source to a plasma having a controlled spatial density. The electric source includes a planar or spherical or dome like coil 24, mounted immediately above window 19 and excited by variable power RF generator 26, typically having a fixed frequency of 13.56 MHz.

Impedance matching network 28, connected between output terminals of RF generator 26 and excitation terminals of coil 24, couples RF power from the generator to the coil. Impedance matching network 28 includes variable reactances which controller 29 varies in a known manner in response to indications of the amplitude and phase angle of the voltage reflected to the input terminals of the matching network, as sensed by detector 43. Controller 29 varies the values of the reactances in network 28 to achieve impedance matching between source 26 and a load including coil 24 and the plasma load the coil drives.

Controller 29 also responds to input device 41 to control variable reactances coupled to coil 24. Input device 41 can be a manual device, such as a potentiometer or keys of a key pad, or a microprocessor responsive to signals stored in a computer memory for different processing recipes of workpiece 32. Variables of the recipes include (1) species of gases flowing through port 20 into chamber 10, (2) pressure in chamber 10 controlled by the vacuum pump connected to port 22, (3) the total output power of RF source 26, which is substantially equal to the power, supplied to coil 24, and (4) the values of capacitors connected to coil 24.

Workpiece 32 is fixedly mounted in chamber 10 to a surface of workpiece holder (i.e., platen or chuck) 30; the surface of holder 30 carrying workpiece 32 is parallel to the surface of window 19. Workpiece 32 is usually electrostatically clamped to the surface of holder 30 by a DC potential that a DC power supply (not shown) applies to a chuck electrode (not shown) of holder 30. RF source 45 supplies a radio frequency electromagnetic wave to impedance matching network 47, that includes variable reactances (not shown). Matching network 47 couples the output of source 45 to holder 30. Controller 29 responds to signals that amplitude and phase detector 49 derives to control the variable reactances of matching network 47 to match the impedance of source 45 to the impedance of an electrode (not shown) of holder 30. The load coupled to the electrode in holder 30 is primarily the plasma in chamber 10. As is well known the RF voltage source 45 applies to the electrode of holder 30 interacts with charge particles in the plasma to produce a DC bias on workpiece 32.

Surrounding coil 24 and extending above top end plate 18 is a metal tube or can-like shield 34 having an inner diameter somewhat greater than the inner diameter of wall 12. Shield 34 decouples electromagnetic fields originating in coil 24 from the surrounding environment. The diameter of cylindrically shaped chamber 10 defines the boundary for the electromagnetic fields generated by coil 24. The diameter of dielectric window structure 19 is greater than the diameter of chamber 10 to such an extent that the entire upper surface of chamber 10 is comprised of dielectric window structure 19.

The distance between the treated surface of workpiece 32 and the bottom surface of dielectric window structure 19 is chosen to provide the most uniform plasma flux on the exposed, processed surface of the workpiece. For a preferred embodiment of the invention, the distance between the workpiece processed surface and the bottom of the dielectric window is approximately 0.2 to 0.4 times the diameter of chamber 10.

Coil 24 includes plural parallel windings each of which is electrically long enough at the 13.56 MHz frequency of source 26 to function as a transmission line having a total electric length of about 30 to 45° to produce standing wave patterns along the length of the winding. The standing wave patterns result in variations in the magnitude of standing wave RF voltages and currents along the lengths of the windings. The dependence of the magnetic fluxes generated by the windings on the magnitude of these RF currents results in different plasma density being produced in different portions of chamber 10 beneath different windings of coil 24.

The variations in the RF current magnitude flowing in different windings of the coil are spatially averaged to assist in controlling plasma density spatial distribution. Spatially averaging these different current values in the different windings of the coil can substantially prevent azimuthal asymmetries in the plasma density, particularly at regions of low RF current in the windings. Alternatively, the frequency of generator 26 is 4.0 MHz, in which case the windings of coil 24 are electrically short, about 10° to 15°, causing the standing wave currents and voltages in the windings to be substantially constant.

Controller 29 includes microprocessor 33 (FIG. 2) which responds to (1) input device 41, (2) voltage amplitude and phase angle signals that detector 31 derives, and (3) memory system 35 that stores programs for controlling microprocessor 33 as well as signals controlling the values of variable capacitors connected to coil 24 and the output power of RF generator 26. Among the programs memory system 35 stores are control programs for the values of the variable reactances of matching networks 28 and 47. The output power of source 26 and the values of capacitors connected to coil 24 can also be pre-set at the time the processor is made or installed, particularly if the processor is dedicated to a single recipe.

Figure 2:
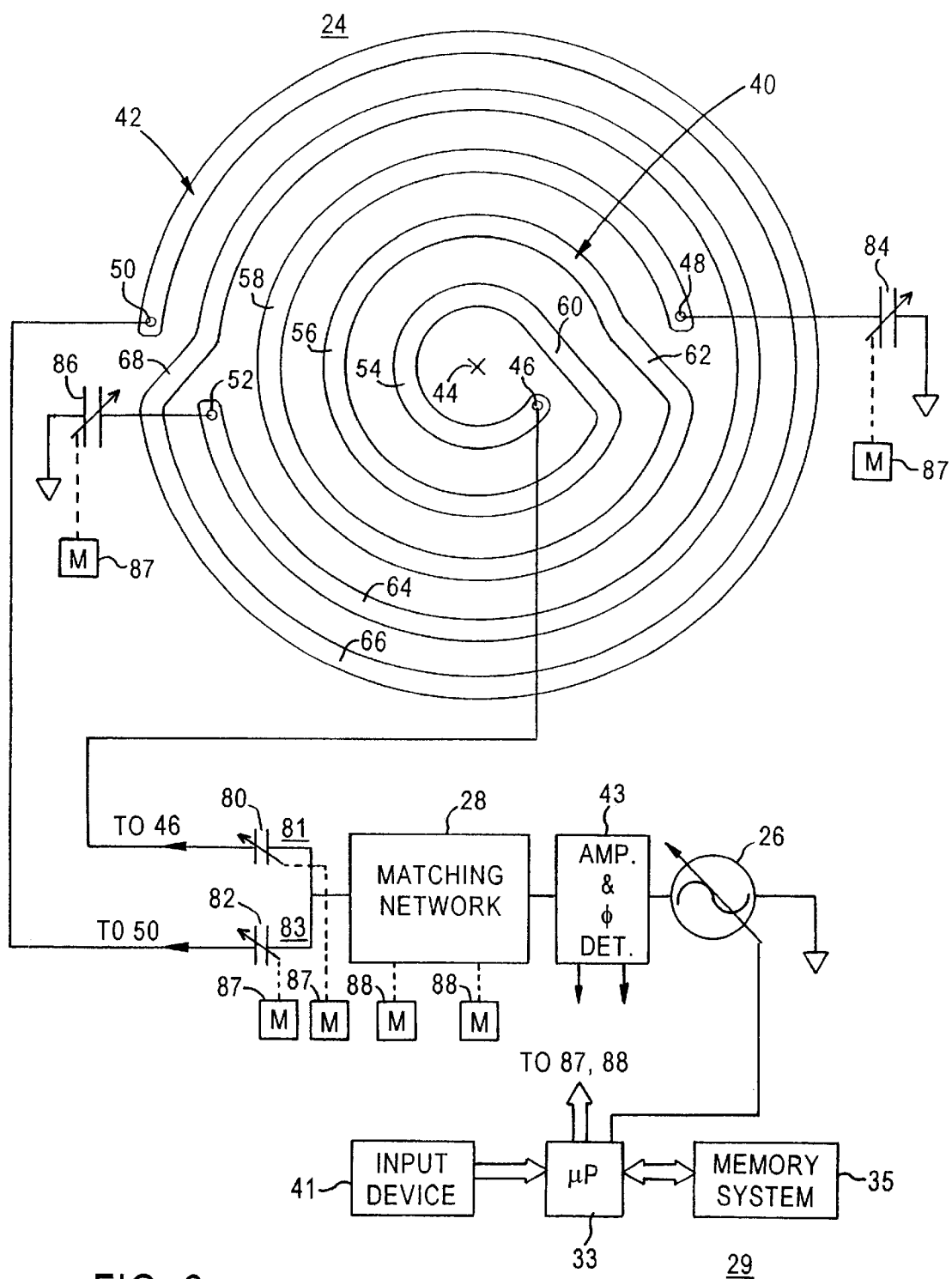
FIG. 2 is an electrical schematic diagram of a coil included in the processor of FIG. 1 in combination with an RF source, a matching network, and electronic control circuitry for driving the coil and for controlling (1) the capacitances of variable capacitors connected to the coil and (2) the total power supplied to the coil.

As illustrated in FIG. 2, coil 24 includes two parallel windings 40 and 42, both of which are generally concentric with center coil axis 44 and include multiple spiral-like turns that extend radially and circumferentially with respect to axis 44. Interior winding 40 is wholly within exterior winding 42, such that winding 42 completely surrounds winding 40. Winding 40 includes interior terminal 46 and exterior terminal 48, while winding 42 includes exterior terminal 50 and interior terminal 52.

Interior winding 40 includes three concentric turns 54, 56 and 58 having different radii, as well as two straight segments 60 and 62. Each of turns 54, 56 and 58 is a segment of a circle centered on axis 44 and having an angular extent of about 340°. Adjacent ends of turns 54 and 56 are connected to each other by straight segment 60, while straight segment 62 connects adjacent ends of turns 56 and 58 to each other. Straight segments 60 and 62 extend radially and circumferentially along substantially parallel paths.

Exterior winding 42 includes two concentric turns 64 and 66 having different radii, as well as straight segment 68. Each of turns 64 and 66 is a segment of a circle centered on axis 44 and having an angular extent of about 340°. Straight segment 68 extends radially and circumferentially to connect adjacent ends of turns 64 and 66 to each other.

The sum of the lengths of turns 54, 56 and 58 and sectors 60 and 62 of winding 40 is about equal to the sum of the lengths of turns 64 and 66, as well as sector 68 of winding 42. Because windings 40 and 42 have substantially equal lengths, they have standing wave voltage and current variations along their length which are substantially the same, regardless of the frequency that generator 26 supplies to them.

Windings 40 and 42 of coil 24 are driven in parallel by RF current derived by a single fixed frequency RF generator 26, having a controlled variable output power. As described infra, at either the low (e.g. 4.0 MHz) or high (e.g. 13.56 MHz) frequency of generator 26, there is a single current maximum in each of windings 40 and 42. At the high frequency, the current maxima are at locations that are about half-way between the terminals of each winding. The current maxima occur at radially opposite points of the windings 40 and 42 relative to axis 44 to provide approximate azimuthal symmetry to the toroidal electric field resulting from RF excitation of windings 40 and 42 by generator 26.

Windings 40 and 42 are respectively in separate parallel circuit branches 81 and 83. Branch 81 includes series connected winding 40 and variable capacitors 80 and 84, while branch 83 includes series connected winding 42 and variable capacitors 82 and 86. The turns of windings 40 and 42 of coil 24 are arranged so that input terminals 46 and 50, which are driven in the parallel by power from the output terminal of matching network 28, are on opposite sides of coil axis 44 so current flows in the same direction from terminals 46 and 50 into the remainder of windings 40 and 42. Terminal 46 is on the smallest radius turn 54 of coil 24 and terminal 58 is on the largest radius turn 66. Terminals 46 and 50 are respectively connected by series variable capacitors 80 and 82 to the output terminal of matching network 28.

Output terminals 48 and 52 of coil 24, which are diametrically opposite to each other relative to axis 44, are connected to a common ground terminal via series variable capacitors 84 and 86.

For the high frequency output of source 26, the values of capacitors 84 and 86 are set such that the standing wave currents in windings 40 and 42 have minimum amplitudes at the input and output terminals 46 and 48 of winding 40 and at terminals 50 and 52 of winding 42, where the standing wave voltages are at maxima. The standing wave currents in windings 40 and 42 have maximum values at radially opposite points of windings 40 and 42, where the standing wave voltages are maxima, a result achieved by adjusting the values of capacitors 84 and 86. The standing wave current maxima can be located by monitoring the standing wave voltages. The current maximum occurs at a place where the voltage is a minimum (close to zero volt). Locating the standing wave current maxima in windings 40 and 42 to be radially opposite to each other assists in providing azimuthally symmetric plasma density.

The values of capacitors 80 and 82 help keep the impedance of each of windings 40 and 42 tuned to matching network 28. The maximum amplitudes of the standing wave currents in windings 40 and 42 are respectively controlled by the values of capacitors 80 and 82. The physical configuration of windings 40 and 42 and the location of terminals 46, 48, 50 and 52 affect the positions of the maximum standing wave currents in windings 40 and 42.

Proper control of the values of capacitors 80, 82, 84 and 86, as well as the total output power of generator 26, i.e., the power that generator 26 applies in parallel to windings 40 and 42, enables the current in one of windings 40 or 42 to remain substantially constant, while providing changes of the current in the other winding. The ability to vary the total power while maintaining the current in one of windings 40 or 42 substantially constant provides substantial control over the electromagnetic field distribution resulting from energization of the windings. By maintaining the current in one of windings 40 or 42 substantially constant, the electromagnetic field produced by that winding, and supplied to the plasma in chamber 10 remains relatively constant. Changing the current in the other winding 40 or 42 causes the electromagnetic field that winding supplies to the plasma in chamber 10 to vary. As described previously, different workpiece processing recipes require the electromagnetic power deposited by winding 40 to remain substantially constant and the power that winding 42 couples to the plasma to be varied. For other recipes, it is desirable for the power distribution that winding 42 supplies to the plasma in chamber 10 to remain constant and the power that branch 40 supplies to the plasma in chamber 10 to be varied.

The values of capacitors 80, 82, 84 and 86, as well as the output power of generator 26, are controlled for different recipes by manual adjustment of these parts or by automatic adjustment thereof in response to signals stored in memory system 35 being read out by microprocessor 33 in response to recipe signals from input controller 41. Alternatively, if a particular coil always operates in connection with a processor having the same recipe, the values of capacitors 80, 82, 84 and 86, as well as the output power of generator 26, can be set at the factory, at the time the processor is manufactured, or during installation of the processor.

Assume each of windings 40 and 42 typically has a resistance of 6 ohms, which enables the RMS (root mean squared) current in winding 42 to be maintained substantially constant and the RMS current in winding 40 to be varied by adjusting the output power of generator 26 and the total reactances ($X_1$) and ($X_2$) of branches 81 and 83 to be in accordance with Table I:

TABLE I

| ↓Cases | $P_{tot}$(W) | $X_1(\Omega)$ | $X_2(\Omega)$ | $I_1$(A) | $I_2$(A) |
|---|---|---|---|---|---|
| ($R_1 = R_2 = 6\Omega$) | | | | | |
| a) Equal currents in 40 and 42 | 1000 | 40 | 40 | 9.13 | 9.13 |
| b) Larger current in 40 than 42 | 1570 | 20 | 30 | 13.36 | 9.12 |
| c) Lower current in 40 than 42 | 850 | 60 | 50 | 7.63 | 9.14 |

Similarly, if it is desired to maintain a substantially constant current in interior winding 40 and a variable current in outer winding 42, the reactances of branch 81 ($X_1$) and branch 82 ($X_2$) and the output power of generator 26 are adjusted in accordance with Table II.

TABLE II

| ↓Cases | $P_{tot}$(W) | $X_1(\Omega)$ | $X_2(\Omega)$ | $I_1$(A) | $I_2$(A) |
|---|---|---|---|---|---|
| ($R_1 = R_2 = 6\Omega$) | | | | | |
| a) Equal currents in 40 and 42 | 1000 | 40 | 40 | 9.13 | 9.13 |
| b) Larger current in 40 than 42 | 1570 | 30 | 20 | 9.12 | 13.36 |
| c) Lower current in 40 than 42 | 850 | 50 | 60 | 9.14 | 7.63 |

By varying the values of capacitors 80, 82, 84 and 86, as well as the power of source 26, control of the plasma density incident on workpiece in both the azimuthal and radial coordinate directions is achieved.

Assume the currents and the impedances are respectively $I_1$ and $z_1$, for branch 81, and are respectively $I_2$ and $z_2$, for branch 83. Since each branch consists of the series combination of an input capacitor, a winding and an output capacitor, the impedance $z_1$ or $z_2$ is the lump sum of all the impedances from the input ($C_1$ or $C_2$) and the output ($C_3$ or $C_4$) capacitors, and the winding ($L_1$ or $L_2$) for branch 81 or branch 83. Thus $z_1=R_1+j[\omega L_1-1/(\omega C_1)-1/(\omega C_3)]=R_1+jX_1$ where $R_1$ and $X_1=\omega L_1-1/(\omega C_3)-1/(\omega C_3)$ respectively represent the real (resistive) and imaginary (reactive) parts of impedance $z_1$. Similarly, $Z_2=R_2+jX_2$, where $R_2$ and $X_2=\omega L_2-1/(\omega C_2)-1/(\omega C_4)$ respectively represent the resistive and reactive parts of impedance $z_2$. The quantitative analysis for the results shown in Tables I and II are given in our co-pending application entitled "INDUCTIVE PLASMA PROCESSOR HAVING COIL WITH PLURAL WINDINGS AND METHOD OF CONTROLLING PLASMA DENSITY," (Lowe Hauptman Gilman and Berner Docket No. 2328-050).

Figure 3:
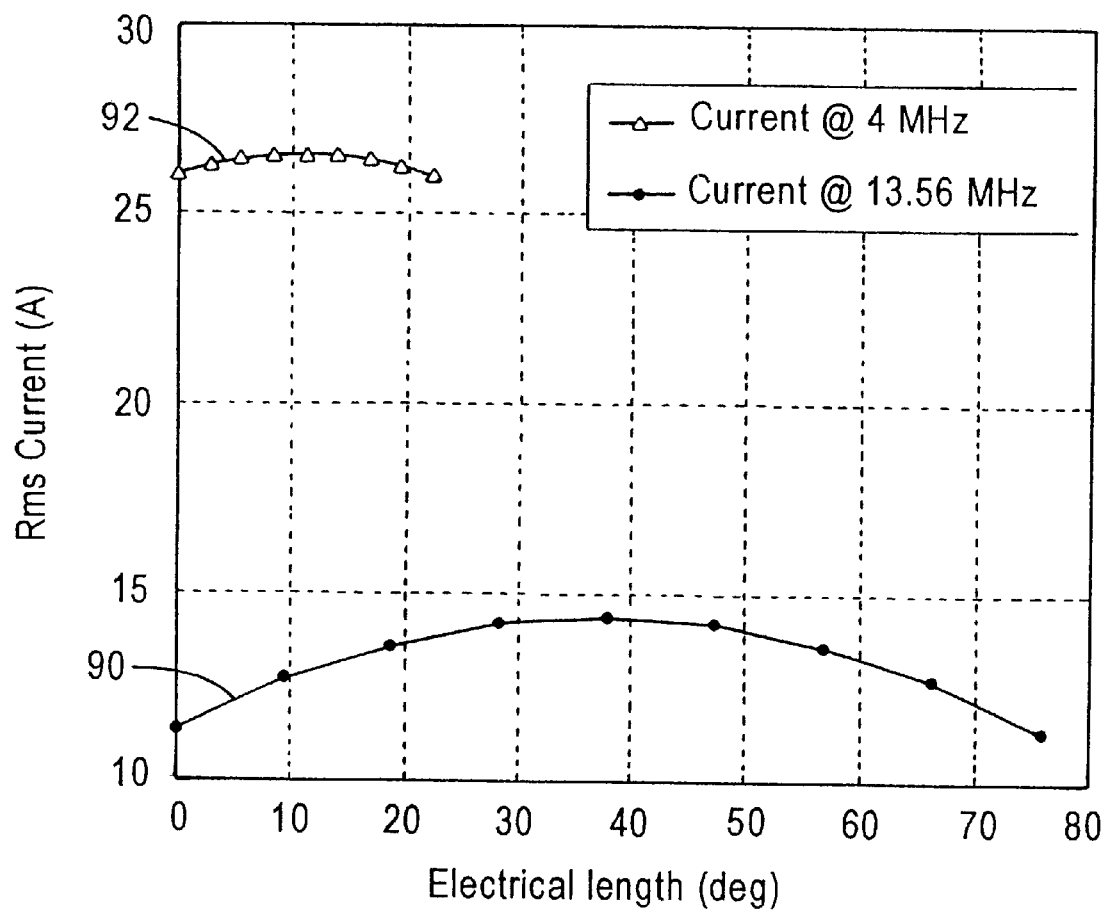
FIG. 3 includes plots of calculated amplitudes of standing wave currents in the windings of the coil illustrated in FIG. 2 for excitations at 13.56 MHz and 4.0 MHz.

For simplicity, assume the frequency of RF source 26 is 13.56 MHz and the electrical length of each of branches 40 and 42 is 77° at 13.56 MHz and the values of capacitors 80, 82, 84 and 86 are properly adjusted so there are equal currents in windings 40 and 42, For such a situation, the standing wave current amplitudes along the lengths of each of windings 40 and 42 are as depicted by curve 90, FIG. 3. Curve 90 has a sinusoidal-like variation between the input and output terminals of each of windings 40 and 42. Curve 90 has a peak value of approximately 14.5 amperes RMS at the midpoint of the curve, i.e., at 38° and minimum equal values of about 10.7 amperes RMS at the input and output terminals of windings 40 and 42. Thus, the maximum standing wave current in each of windings 40 and 42 exceeds the minimum standing wave current by approximately 3.8 amperes RMS, i.e., by about 21%.

A possible problem with operating the arrangement of FIG. 2 at a frequency of 13.56 MHz is that capacitors 80, 82, 84 and 86 might have to be adjusted simultaneously or in an iterative manner to maintain the desired relationship for the electromagnetic field distributions derived from windings 40 and 42. For example, to maintain an azimuthally symmetric density on the workpiece, requires the maximum currents in each coil to be located radially opposite to each other relative to axis 44. This is achieved by adjusting the values of capacitors 84 and 86 connected between the output terminals of windings 40 and 42 and ground. Adjusting the values of capacitors 84 and 86 may require adjustment of capacitors 80 and 82 to provide the desired values of standing wave current to achieve the values indicated in Tables I and II. However, adjusting the values of capacitors 80 and 82 can cause a further shift in the current standing wave patterns in windings 40 and 42, whereby the maxima of the current standing wave patterns are no longer diametrically opposed relative to coil axis 44. If the current standing wave maxima are shifted in this manner, further adjustment of the values of capacitors 84 and 86 may be necessary.

To overcome this problem, we have realized that if the current variations along windings 40 and 42 can be substantially reduced, such that the location of the standing wave current maxima in windings 40 and 42 is not critical, i.e., the maxima do not have to be on diametrically opposite sides of coil axis 44, that only a single variable capacitor need be connected to each of windings 40 and 42. In other words, the necessity to simultaneously or iteratively adjust all four capacitors 80, 82, 84 and 86 would be obviated.

To these ends, the frequency of RF source 26 is reduced so that the transmission line effects of windings 40 and 42 are substantially reduced. If the electrical length of each of windings 40 and 42 is substantially less than about 45°, the percent change between the maximum and minimum values of the standing wave current is reduced sufficiently to enable only a single variable capacitor 84 and 86 to be connected in series with windings 40 and 42, respectively, and the need for any capacitor to be connected between each winding input terminal and the power output terminal of matching network 28 is obviated.

As mentioned previously, the frequency of RF source 26 is reduced to 4.0 MHz from 13.56 MHz, resulting in a decrease in the electrical length of windings 40 and 42 by a factor of 3.4. Curve 92, FIG. 3, represents the situation of capacitors 84 and 86 being adjusted so equal standing wave currents are in windings 40 and 42. The same physical windings that are analyzed at 13.56 MHz (shown in curve 90) are re-analyzed at 4.0 MHz (shown in curve 92). The electrical length of each of branches 40 and 42 becomes 22.6° (i.e., 77° divided by 3.4). Curve 92 has standing wave current minima of approximately 25.7 amperes RMS at the input and output terminals of windings 40 and 42 and a maximum standing wave current of approximately 26 amperes RMS at the centers of the windings. Despite the fact that substantially larger currents flow in windings 40 and 42 for the short transmission line situation of curve 92 than for the long transmission line situation of curve 90, the output power of source 24 is the same, 2400 watts, for both situations. For the exemplary equal current curves 90 and 92 of FIG. 3, the capacitances of capacitors 84 and 86 are equal to each other and have a value of 137 picofarads (pF) for the 13.56 MHz frequency of source 26, while the values of capacitors 84 and 86 are 1808 pF for the 4.0 MHz excitation of source 26.

The percentage change between the maxima and maximum standing wave currents of curve 92 is about 2%, in contrast with the 21% change of curve 90. Because a relatively low frequency of excitation source 26 results in a relatively small change between the minima and maximum standing wave currents of windings 40 and 42, there is a relatively uniform azimuthal electromagnetic field produced by each of windings 40 and 42 and supplied to the plasma in chamber 10. Consequently, the need to include capacitors 80 and 82, to adjust the position of the maximum standing wave currents in windings 40 and 42 does not exist. Tables I and II provide the information necessary for the low frequency excitation to adjust the capacitances of capacitors 84 and 86 and the output power of RF source 26 to achieve constant currents in coils 40 and 42, respectively.

The ratio $(I_1/I_2)$ of the maximum standing wave currents in windings 40 and 42 can be varied continuously from 20:1 to 1:1, then from 1:1 to 1:10, for the 4.0 MHz excitation power of source 26, by adjusting the value of capacitor 84, while maintaining the value of capacitor 86 constant, and then by adjusting the value of capacitor 86, while maintaining the value of capacitor 84 constant, where $I_1$ is the maximum standing wave current in winding 40 and $I_2$ is the maximum standing wave current in winding 42. As the values of capacitors 84 and 86 are varied, the output power of source 26 is varied to provide the same effects as indicated by Tables I and II.

To control the values of capacitors 80, 82, 84 and 86, in response to output signals of microprocessor 33, each of the capacitors is driven by a different one of DC motors 87. Each of motors 87 responds to a different output signal of microprocessor 33. The signals microprocessor 33 supplies to motors 87 have values commensurate with the amount that the output shafts of the motors are to be turned to achieve the desired capacitance values of capacitors 80, 82, 84 and 86. Matching network 28 includes variable reactances (preferably capacitors, FIG. 4) which are driven by motors 88. Motors 88 respond to different signals microprocessor 33 derives in response to signals derived by a program stored by memory system 35 and detector 43. Detector 43 derives signals representing (1) the voltage amplitude reflected by matching network 28 toward generator 26 and (2) the difference in phase between the reflected voltage and current. Microprocessor 33 supplies a suitable DC signal to generator 26 to control the generator output power. Microprocessor 33 responds to signals indicative of the voltage applied in parallel to branches 81 and 83 and by RF source 26 and matching network 28, as well as signals indicative of the standing wave currents at the output terminals 48 and 52 of branches 81 and 83, as derived by circuitry described in connection with FIG. 4.

Figure 4:
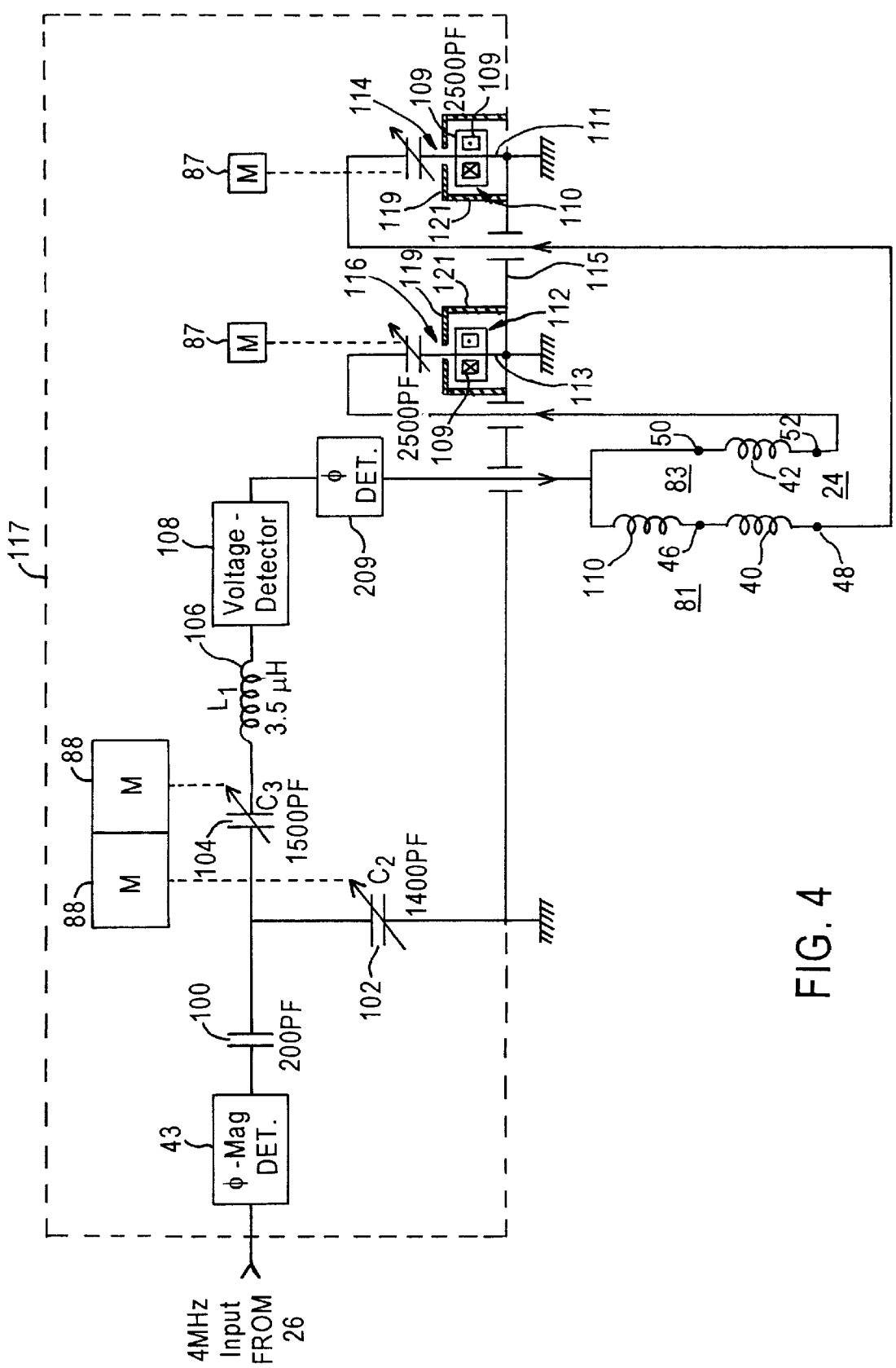
FIG. 4 is a circuit diagram of a preferred embodiment of the matching network of FIG. 2 with sensors for the current driving the coil of FIG. 2.

Reference is now made to FIG. 4 of the drawing, a circuit diagram of a preferred embodiment of electronic circuitry associated with 4.0 MHz drive of coil 24. RF source 26 drives matching circuit 28 via phase and magnitude detectors 43 and fixed series capacitor 100, preferably having a capacitance of 2000 pF. Matching network 28 includes variable shunt capacitor 102 and variable series capacitor 104 having capacitance values which are varied by motors 88.

The output power of matching circuit 28 is coupled in parallel to branches 81 and 83 via series inductor 106, RF voltage detector 108 and phase detector 109. RF voltage detector 108 derives a DC voltage indicative of the peak amplitude of the RF voltage at the joint input terminals of branches 81 and 83, while phase detector 109 derives a DC voltage indicative of the difference in phase between the RF voltage and current at the joint input terminals of branches 81 and 83. The outputs of detectors 108 and 109 are fed back to microprocessor 33 which in turn controls motors 87 and the output power of generator 26 to achieve the previously discussed results. The currents flowing through branches 81 and 83 are respectively coupled to ground via variable capacitors 84 and 86.

Figure 5:
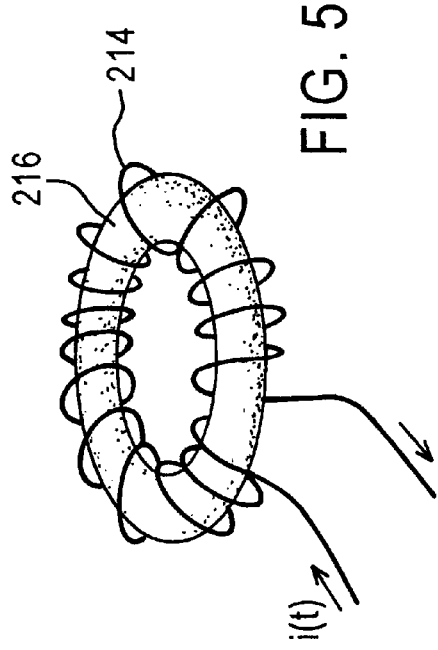
FIG. 5 is a schematic diagram of a current sensor used in the circuit of FIG. 4 and its circuitry.
Figure 6:
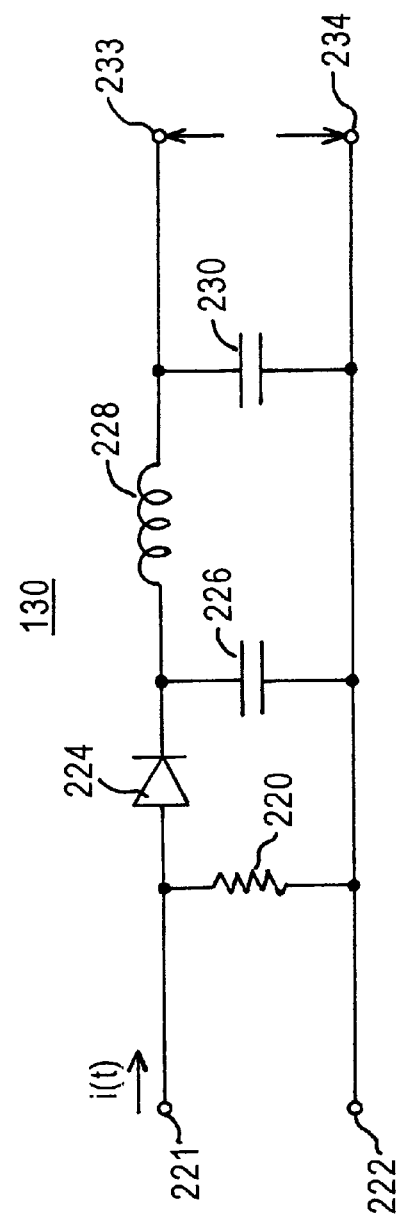
FIG. 6 is a circuit diagram of detecting circuitry driven by the current sensor of FIG. 5.

The magnitudes of standing wave currents at output terminals of branches 81 and 83 are respectively detected by current amplitude sensors 110 and 112, respectively inductively coupled to wire leads 111 and 113 that are connected between the low voltage ends of capacitors 84 and 86 and ground. As shown in FIG. 5, each of current sensors 110 and 112 includes a current transformer made of a toroidal winding 214 wound around a toroidal core 216. The RF current I(t) flowing through lead 111 or 113 produces a time-varying magnetic field B(t) (indicated as loop 126) in core 216. The magnetic field B(t) induces a time-varying electric field or equivalently the induced current i(t) in each turn 124 of the toroidal winding 214. The direction of induced current i(t) illustrated in FIG. 5 assumes that the magnitude of the driving current I(t) flowing through lead 111 or 113 increases with time, i.e., dI(t)/dt>0, since i(t) is proportional to $$-\frac{dB(t)}{dt},$$

which is also proportional to $$-\frac{dI(t)}{dt}.$$

Core 216 can be made of ferrimagnetic material (known as ferrite) or ferromagnetic material (e.g., iron) to further enhance mutual inductive coupling between a driving current flowing through lead 111 or 113 and the induced current flowing through winding 214.

Induced current i(t) flows through resistor 220 between the two input terminals 221 and 222 of circuit 130 and produces a sinusoidal waveform across resistor 220. This sinusoidal waveform is rectified by diode 224 such that only positive voltages greater than the diode threshold voltage (typically 0.6–0.7 v) can pass through the diode. Capacitor 226, inductive choke 228, and capacitor 230 form a low-pass filter which produces a DC voltage, V, across the circuit output terminals 233 and 234. Voltage V can be supplied to microprocessor 33 to indicate the currents respectively flowing through terminals 48 and 52.

Figure 7:
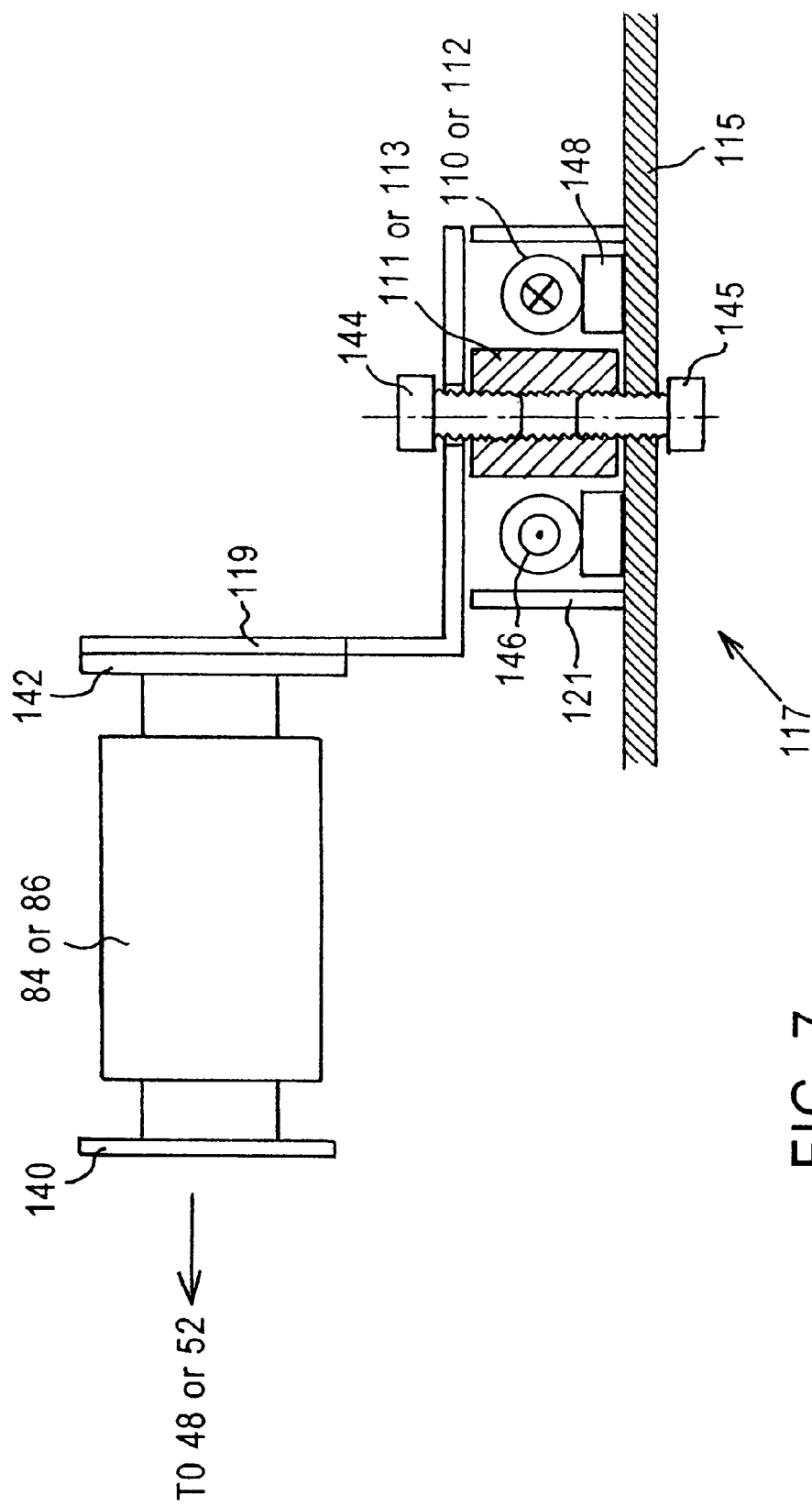
FIG. 7 is a schematic diagram of a preferred embodiment of a mechanical mounting structure for the current sensor.

The mechanical mounting for the current sensor 110 or 112 in a preferred embodiment is illustrated schematically in FIG. 7. Capacitor 84 or 86 has one end plate 140 connected to terminal 48 or 52 and a second end plate 142 connected to shield 119. Lead 111 or 113 is made of an electrically conducting metal, preferably silver plated copper, and machined to a cylinder with a threaded center bore. Lead 111 or 113 is inserted in a central opening of current sensor 110 or 112, which is also supported by and mounted on insulating disk 148. The electrical connection is made by tightening metal screws 144 and 145 into the threaded hole in lead 111 or 113 such that the same current from terminal 48 or 52 flows through capacitor 84 or 86, shield 119, lead 111 or 113, and eventually to ground plate 115 in housing 117. As previously described, the current flowing through lead 111 or 113 produces a time-varying magnetic field, which in turn produces an induced current in toroidal winding 214. The lead wires of sensors 110 or 112 are connected to an electrical connector (not shown), mounted on ground plate 115 in a region enclosed by cylindrical shield 121.

Grounded electromagnetic shields 114 and 116 are respectively interposed between current sensors 110 and 112 and capacitors 84 and 86 to minimize electromagnetic interference from RF fields of the remaining apparatus, particularly from windings 40 and 42. Shield 114 or 116 consists of a ring-shaped metal plate 119 and shield 121. Shield 119 has an opening for lead 111 or 113 to run through. Shield 121 is a metal cylinder which horizontally encloses sensor 110 or 112 and lead 111 or 113. Together with shield 119 and plate 115, which vertically sandwich the sensor, sensor 110 and 112 and lead 111 or 113 are completely shielded from ambient RF fields, thereby greatly improving the accuracy of the current sensor. Shields 119 and 121 are preferably made of silver-plated copper. Shield 121 is mechanically and electrically connected only to plate 115. All the voltages at the output terminals of windings 40 and 42 are across capacitors 84 and 86 so end plates 142 of the capacitors connected to leads 111 and 113 are virtually at ground. Shields 114 and 116 and current detectors 110 and 112 are arranged together with detector 43, capacitors 100, 102 and 104, coil 106 and detectors 108 and 109 in metal housing 117.

Referring back to FIG. 4 of the drawing, each of capacitors 84, 86, 100, 102 and 104 is a vacuum capacitor capable of handling relatively large currents which flow from RF source 26 to windings 40 and 42. Because of the relatively short electrical length of each of windings 40 and 42 at 4 MHz, relatively large capacitance values are required for capacitors 84 and 86, with typical maximum values of the capacitors being 2500 pF. Shunt load capacitor 102 has a relatively large maximum value of 1400 pF to match the low impedance of parallel branches 40 and 42. Series capacitor 104 is a relatively large capacitor, having a maximum value of 1500 pF to tune the low inductive reactances of parallel branches 81 and 83.

Fixed input series connected capacitor 100, preferably having a value of 200 pF, provides part of the impedance transformation between source 26 and the parallel windings 40 and 42 of coil 24. Capacitor 100 is included to enable shunt, load capacitor 102 to have a more reasonable value; otherwise, capacitor 102 would have a considerably higher capacitance value than the values associated with a capacitor having a maximum value of 1400 pF. Fixed capacitor 100 also provides better tuning resolution, to attain better resonant tuning of matching circuit 28 with parallel windings 40 and 42 of coil 24.

Fixed inductor 106, preferably having a relatively large value of 3.5 microhenries, extends the tuning range of matching network 28. Inductor 110, which is outside housing 117 and is optionally connected to interior winding 40, can be employed to provide substantially equal impedances for the parallel branches 81 and 83 associated with windings 40 and 42. Inductor 110 is used if winding 42 has an inductance substantially greater than the inductance of winding 40.

Voltage detector 108 and current sensors 110 and 112 supply signals to microprocessor 33. Microprocessor 33 responds to the signals from voltage detector 108, current sensors 110 and 112 and the phase indication detector 109 and derives an indication of the total output power RF source 26. The indication of total power controls the output power of RF generator 26 to enable the powers indicated by Tables I and II to be achieved. The signals that current sensors 110 and 112 derive are used by microprocessor 33 to control the motors which vary the capacitances of capacitors 84 and 86 to assure that the correct currents are flowing in windings 40 and 42 to achieve the currents specified in Tables I and II.

When the processor is being made, interior winding 40 is turned relative to exterior winding 42 to assist in controlling the azimuthal electric field distribution and the azimuthal plasma density distribution. Winding 40 is turned about axis 44 so terminals 46 and 48 can be at locations different from those illustrated in FIG. 2. Winding 40 can be turned to a predetermined position if the processors of the same type have consistent azimuthal electric field and plasma density distributions from processor to processor. If, however, different processors of the same type have differing azimuthal electric field and plasma density distributions from processor to processor, winding 40 is turned relative to winding 42 until tests indicate optimum uniform plasma distribution is achieved in each particular processor.

While there have been described and illustrated specific embodiments of the invention, it will be clear that variations in the details of the embodiments specifically illustrated and described may be made without departing from the true spirit and scope of the invention as defined in the appended claims. For example, many of the principles of the invention are not limited to coils having two concentric windings but are applicable to coils having one or more windings.

What is claimed is:

1. An inductive plasma processor comprising an RF plasma excitation coil including a winding having an input terminal and an output terminal, the winding having one end connected in a branch in series with a matching network and an RF source and a second end having a lead to ground so the same current which flows through the winding output terminal flows through the lead, a current sensor coupled to the lead, and a grounded shield coupled with the current sensor for shielding electromagnetic interference from an ambient RF environment.

2. The processor of claim 1 further including a capacitor connected in series between the coil output terminal and the lead for coupling current from the winding through the lead to ground.

3. The processor of claim 2 wherein the sensor includes a toroidal structure and is between the capacitor and ground, the sensor having an RF voltage and RF fields substantially at zero.

4. The processor of claim 3 wherein the toroidal structure includes a toroidal core.

5. The processor of claim 2 wherein the sensor includes a toroidal structure surrounding the lead, the grounded shield substantially surrounding the toroidal structure.

6. The processor of claim 1 wherein the sensor includes a toroidal structure surrounding the lead, and the grounded shield substantially surrounds the toroidal structure.

7. The processor of claim 6 wherein the toroidal structure includes a toroidal core.

8. The processor of claim 1 wherein the coil includes plural windings, each of the plural windings being in a separate branch and including an input terminal and an output terminal, each of the input terminals being connected to be driven in parallel by the RF source, each of the output terminals being connected by a separate lead to ground, a separate current sensor coupled to each of the separate leads, and a grounded shield arrangement coupled with each current sensor for decoupling RF fields from the current sensors.

9. The processor claim 8 wherein each branch includes a capacitor connected between the output terminal of the winding of the respective branch and the lead of the respective branch for coupling current from the winding of the respective branch to the lead of the respective branch.

10. The processor of claim 9 wherein the sensor includes a toroidal structure and is between the capacitor and the lead, the sensor having an RF voltage and RF fields substantially at zero.

11. The processor of claim 10 wherein each of the toroidal structures includes a toroidal coil.

12. The processor of claim 8 wherein each of the sensors includes a toroidal structure surrounding the lead, and each of the grounded shields substantially surrounds its associated toroidal structure.

13. The processor of claim 12 wherein each of the toroidal structures includes a toroidal coil.

14. The processor of claim 9 wherein each of the sensors includes a toroidal structure surrounding the lead, and each of the grounded shields substantially surrounds its associated toroidal structure.

* * * * *